United States Patent
Seo et al.

(10) Patent No.: US 7,586,293 B2
(45) Date of Patent: Sep. 8, 2009

(54) DIGITAL MODULATION CIRCUIT

(75) Inventors: Man Suk Seo, Gyunggi-do (KR);
Hyung Cheol Park, Daejeon (KR);
Seong Soo Lee, Gyunggi-do (KR); Sang Yub Lee, Gyunggi-do (KR); Chang Soo Yang, Gyunggi-do (KR); Wan Cheol Yang, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 83 days.

(21) Appl. No.: 11/847,761

(22) Filed: Aug. 30, 2007

(65) Prior Publication Data
US 2008/0055139 A1 Mar. 6, 2008

(30) Foreign Application Priority Data
Aug. 31, 2006 (KR) .................... 10-2006-0083566

(51) Int. Cl.
*H04L 27/20* (2006.01)
(52) U.S. Cl. .............. 322/105; 322/103; 322/112; 322/113; 375/146; 375/239; 375/308
(58) Field of Classification Search .......... 332/103, 332/104, 105, 112, 113, 144, 146; 375/130, 375/131, 140, 146, 239, 279, 282, 308, E1.002
See application file for complete search history.

(56) References Cited
U.S. PATENT DOCUMENTS

| | | | | |
|---|---|---|---|---|
| 5,271,034 A | * | 12/1993 | Abaunza | 375/150 |
| 7,109,805 B2 | * | 9/2006 | Lee et al. | 331/23 |
| 2004/0196939 A1 | * | 10/2004 | Co | 375/376 |
| 2007/0206659 A1 | * | 9/2007 | Nakadaira | 375/130 |

FOREIGN PATENT DOCUMENTS
JP 8125704 A 5/1996

* cited by examiner

*Primary Examiner*—Robert Pascal
*Assistant Examiner*—Ryan J. Johnson
(74) *Attorney, Agent, or Firm*—Lowe Hauptman Ham & Berner

(57) ABSTRACT

Provided is a digital modulation circuit constructed with only a digital circuit. The digital modulation circuit includes: a clock generator which generates a reference clock pulse having a predetermined period; an up/down counter which generates a count value having predetermined bits by up-counting or down-counting the reference clock pulse and outputs a bit in the count value as a transmission signal; a controller which determines a counting start/end time point of the up/down counter and determine which one of the up-counting operation and the down-counting operation of the up/down counter is to be performed, according to a value of digital transmission data that is to be transmitted; and a band-pass filter which converts a waveform of the transmission signal output from the up/down counter into a sine waveform.

8 Claims, 4 Drawing Sheets

DIGITAL MODULATION CIRCUIT

CROSS-REFERENCE TO RELATED APPLICATIONS

This application claims the priority of Korean Patent Application No. 2006-83566 filed on Aug. 31, 2006, in the Korean Intellectual Property Office, the disclosure of which is incorporated herein by reference.

BACKGROUND OF THE INVENTION

1. Field of the Invention

The present invention relates to a digital modulation circuit which can be applied to a digital communication system, and more particularly, to a digital modulation circuit using a pulse, capable of reducing power consumption and being implemented in a simple structure.

2. Description of the Related Art

In general, wireless communication employs a modulation method of mixing a data signal (baseband signal) with a local oscillation signal in order to perform communication within a bandwidth determined as a standard. The modulation method is directly applied to an ultra-wideband communication using a pulse.

However, since the conventional modulation method of mixing the local oscillation signal uses a phase locked loop (PLL) circuit in order to fix a frequency of the local oscillating signal, there are problems in that a structure of a transmitter is complicated, and power consumption of the transmitter increases. In addition, when the conventional modulation method of mixing the local oscillation signal is employed, there is a problem in that a structure for synchronization acquisition of a carrier signal to implement a receiver having a synchronization scheme is very complicated.

SUMMARY OF THE INVENTION

An aspect of the present invention provides a digital modulation circuit capable of reducing power consumption generated by a phase locked loop circuit and the like by using only a digital circuit and easily perform synchronization acquisition of a carrier signal in a receiver.

According to an aspect of the present invention, there is provided a digital modulation circuit, including: a clock generator which generates a reference clock pulse having a predetermined period; an up/down counter which generates a count value having predetermined bits by up-counting or down-counting the reference clock pulse and outputs a bit in the count value as a transmission signal; a controller which determines a counting start/end time point of the up/down counter and determine which one of the up-counting operation and the down-counting operation of the up/down counter is to be performed, according to a value of digital transmission data that is to be transmitted; and a band-pass filter which converts a waveform of the transmission signal output from the up/down counter into a sine waveform.

In the above aspect of the present invention, the up/down counter may output the least significant bit in the count value as the transmission signal.

In addition, a period of the transmission signal may be an integer multiple of a period of the reference clock pulse.

In addition, the controller may include: a microprocessor which generates an up/down signal for determining the up-counting operation or the down-counting operation of the up/down counter according to the value of the digital transmission data that is to be transmitted, generates an enable signal for determining the counting start of the up/down counter, and sets a symbol size of a modulated signal; and a counting comparator which receives the count value of the up/down counter, sets a counting end count value according to the symbol size set by the microprocessor, and when receives the set counting end count value, generates a reset signal for determining a counting end of the up/down counter.

In addition, when a rising edge of the enable signal is detected while the up/down signal is in a high-state, the up/down counter may start the up-counting operation to count a rising edge of the reference clock pulse and end the up-counting operation at a rising edge of the reset signal, and when the rising edge of the enable signal is detected while the up/down signal is in a low-state, the up/down counter may start the down-counting operation to count the rising edge of the reference clock pulse and end the down-counting operation at the rising edge of the reset signal.

In addition, after the counting comparator receives a count value which is output when the counting operation is performed the same number of times as the symbol size, the counting comparator may output a rising edge of the reset signal at a next counting time point, and the up/down counter may stop the counting operation at the rising edge of the reset signal.

According to another aspect of the present invention, there is provided a digital modulation circuit, including: a clock generator which generates a reference clock pulse having a predetermined period; an up/down counter which generates a count value having 4 bits by up-counting or down-counting a rising edge of the reference clock pulse and outputs the least significant bit in the count value having 4 bits as a transmission signal; a microprocessor which starts the up/down counter performing the counting operation when receives digital transmission data that is to be transmitted, determines which one of the up-counting operation and the down-counting operation of the up/down counter is to be performed according to a type of the received digital transmission data, and sets a symbol size of a modulated signal; a counting comparator which receives the count value having 4 bits of the up/down counter, and stops the counting operation of the up/down counter after receiving a count value which is output when the counting operation is performed the same number of times as the symbol size set by the microprocessor; and a band-pass filter which converts a waveform of the transmission signal output from the up/down counter into a sine waveform.

In the above aspect of the present invention, the symbol size may be 4 bits, and the counting comparator may stop the counting operation of the up/down counter after receiving the count value of [0 1 0 0] or [1 0 1 1].

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In addition, terms that are defined in the description are defined in consideration of functions according to the present invention and may be changed according to an intention of those of ordinary skill or a usage. Therefore, the terms should not be construed as limiting components of the present invention.

Figure 1:
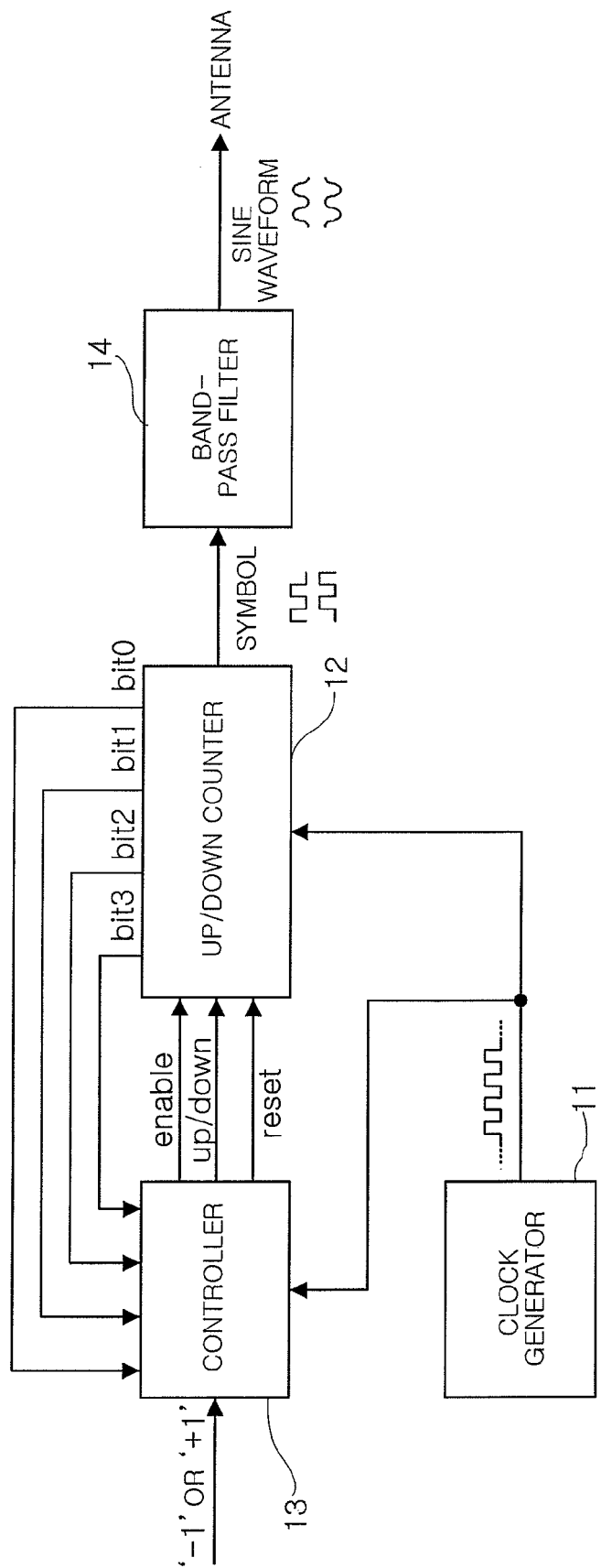
FIG. 1 is a block diagram illustrating a digital modulation circuit according to the present invention.

FIG. 1 is a block diagram illustrating a digital modulation circuit according to the present invention.

Referring to FIG. 1, the digital modulation circuit according to the present invention includes a clock generator 11, an up/down counter 12, a controller 13, and a band-pass filter 14.

The clock generator 11 generates a reference clock pulse used for data transmission. For example, when an ultra-wideband (UWB) system is applied, a clock pulse having a period of 2 ns may be used.

The up/down counter 12 generates a count value having predetermined bits by up-counting or down-counting the reference clock pulse. For example, the up/down counter 12 generates the count value by up-counting or down-counting a rising edge of the reference clock pulse. Operations of the up/down counter 12 are started or ended by control of the controller 13, and which one of the up-counting operation and the down-counting operation is to be performed is determined by control of the controller 13. In addition, a bit in the count value generated by the up/down counter 12 is output as a modulated transmission signal (symbol). The transmission signal is a carrier signal obtained by modulating a digital value that is to be transmitted. In the specification, the modulated transmission signal, the symbol, and the carrier signal are the same signal. Preferably, the modulated transmission signal output from the up/down counter 12 may be the least significant bit of the up/down counter 12.

The controller 13 receives digital transmission data (for example, '+1' and '−1') having information that is to be transmitted and controls the operations of the up/down counter 12. Specifically, the controller 13 determines a start time point and an end time point of the counting operations of the up/down counter 12 and determines which one of the up-counting operation and the down-counting operation of the up/down counter 12 is to be performed.

Figure 2:
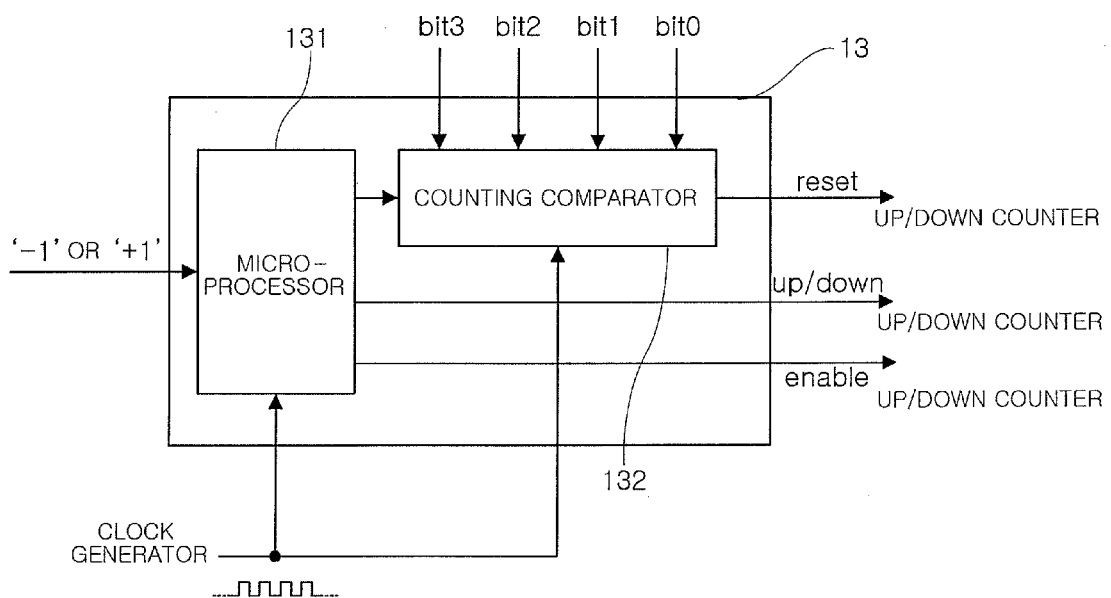
FIG. 2 is a detailed block diagram illustrating a controller applied to a digital modulation circuit according to the present invention.

FIG. 2 is a block diagram illustrating a construction of the controller 13 in detail.

Referring to FIG. 2, the controller 13 may include a microprocessor 131 and a counting comparator 132.

The microprocessor 131 generates an up/down signal for determining the up-counting operation or the down-counting operation of the up/down counter 12 according to a value of the digital transmission data that is to be transmitted, and generates an enable signal for determining a counting start of the up/down counter 12. In addition, the microprocessor 131 sets a symbol size of the modulated signal to enable the counting comparator 132 to determine a time point to end the operation of the up/down counter 12 according to the set symbol size.

The counting comparator 132 receives the count value of the up/down counter 12, sets a counting end count value according to the symbol size set by the microprocessor 131, and when receives the set counting end count value from the up/down counter 12, generates a reset signal for determining a counting end of the up/down counter 12 and transmits the reset signal to the up/down counter 12.

The band-pass filter 14 converts the transmission signal output from the up/down counter 12, that is, the least significant bit of the count value counted by the up/down counter 12 into a sine waveform. The transmission signal output from the up/down counter 12 has a square waveform. The transmission signal having the square waveform is converted to have a form in which an edge portion is cut while passing through the band-pass filter 14 and therefore has the sine waveform so as to be transmitted to an antenna.

Figure 3:
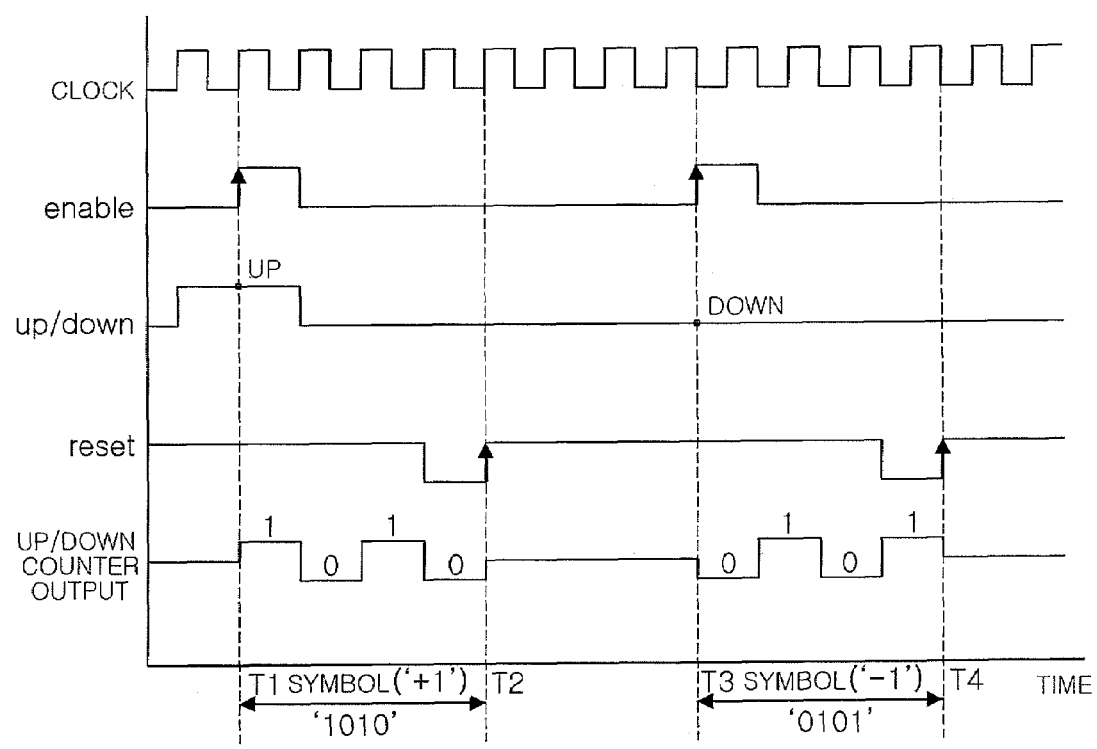
FIG. 3 is a waveform diagram for explaining operations of a digital modulation circuit according to the present invention.

FIG. 3 is a waveform diagram for explaining the operations of the digital modulation circuit according to the present invention. Hereinafter, the operations according to the present invention will be described with reference to the block diagrams illustrated in FIGS. 1 and 2 and the waveform diagram illustrated in FIG. 3.

Referring to FIG. 3, a T1-T2 section is a section for generating a transmission signal, that is, a symbol which is output from the up/down counter 12 when the digital data having information that is to be transmitted has the value of '+1'. A T3-T4 section is a section for generating a symbol which is output from the up/down counter 12 when the digital data that is to be transmitted has the value of '−1'. Hereinafter, the operations of the digital modulation circuit according to the present invention in a case where the symbol size of the digital data that is to be transmitted is 4 bits and the digital data has the value of '+1' or '−1' are described.

First, when the digital data '+1' that is to be transmitted is input to the controller 13, more specifically, to the microprocessor 131 in the controller 13, the microprocessor 131 outputs a rising edge of the enable signal for instructing the up/down counter 12 to start the counting operation at a time point T1 when a rising edge of the reference clock pulse occurs. In addition, the microprocessor 131 controls an up/down signal to be in a high-state at the time point T1 so that the up/down counter 12 performs the up-counting operation. In addition, the symbol size is set to 4 bits in the microprocessor 131, and the microprocessor 131 transmits information about the symbol size to the counting comparator 132.

Since the up/down signal is in the high-state at the rising edge of the enable signal output from the microprocessor 131, the up/down counter 12 starts to perform the up-counting operation. In the description, operations of the 4-bit up/down counter 12 as illustrated in FIGS. 1 and 2 are described. The 4-bit up/down counter 12 generates a count value having a 4-bit binary number. In the up-counting operation, when an initial counting operation is performed at the time point T1, the least significant bit (bit0) has a value of 1 and remaining upper bits (bit1 to bit3) have a value of 0. Specifically, when the count value of the up/down counter 12 is represented as a form of [bit3 bit2 bit1 bit0] in order from upper bits, the count value increases from [0 0 0 0] during the up-counting operation. Therefore, the up/down counter 12 generates a count value of [0 0 0 1] in the initial counting operation, and sequentially generates count values of [0 0 1 0], [0 0 1 1], [0 1 0 0], . . . at time points when a rising edge of the reference clock occurs. The generated count values are input to the counting comparator 132 in the controller 13.

The up/down counter 12 sequentially outputs the least significant bits of the count values as a transmission signal, that is, a symbol for the digital data of '+1'. As described above, the symbol (4 bits) generated when the up/down counter 12 performs the up-counting operation becomes [1 0 1 0].

In the current embodiment, the symbol has 4 bits, so that the up/down counter 12 has to stop the counting operation after outputting the fourth least significant bit as the transmission signal. For this, when the symbol size is determined to be 4 bits, and the count value input to the counting comparator 132 is the fourth count value, the counting comparator 132 generates a rising edge of the reset signal for stopping the counting operation, at the time point T2 and transmits the rising edge to the up/down counter 12. Specifically, when a count value of [0 1 0 0] is input to the counting comparator 132, the counting comparator 132 generates the rising edge of the reset signal at a first rising edge of the reference clock pulse. Thereafter, when the rising edge of the reset signal is input to the up/down counter 12, the up/down counter 12 stops the counting operation.

Through a series of the aforementioned operations, the digital data corresponding to the value of '+1' is modulated to generate a 4-bit symbol of [1 0 1 0].

Next, when the digital data of '−1' that is to be transmitted is input to the microprocessor 132 in the controller 13, the microprocessor 13 outputs a rising edge of the enable signal for instructing the up/down counter 12 to start the counting operation at the time point T3 when the rising edge of the reference clock pulse occurs. In addition, the microprocessor 131 controls the up/down signal to be in a low-state at the time point T3 so that the up/down counter 12 performs the down-counting operation. Similar to in the up-counting operation, the symbol size is set to 4 bits in the microprocessor 131, and the microprocessor 131 transmits information about the symbol size to the counting comparator 132.

Since the up/down signal is in the low-state at the rising edge of the enable signal output from the microprocessor 131, the up/down counter 12 starts to perform the down-counting operation. Similarly to the description of the up-counting operation, in the down-counting operation, when an initial counting operation is performed at the time point T3, the least significant bit (bit0) has a value of 0 and remaining upper bits (bit1 to bit3) have a value of 1. Specifically, when the count value of the up/down counter 12 is represented as a form of [bit3 bit2 bit1 bit0] in order from upper bits, the count value decreases from [1 1 1 1] during the down-counting operation. Therefore, the up/down counter 12 generates a count value of [1 1 1 0] in the initial counting operation, and sequentially generates count values of [1 1 0 1], [1 1 0 0], [1 0 1 1], ... at time points when a rising edge of the reference clock occurs. The generated count values are input to the counting comparator 132 in the controller 13.

The up/down counter 12 sequentially outputs the least significant bits of the count values as a transmission signal, that is, a symbol for the digital data of '−1'. As described above, the symbol (4 bits) generated when the up/down counter 12 performs the down-counting operation becomes [0 1 0 1].

In the current embodiment, the symbol has 4 bits, so that the up/down counter 12 has to stop the counting operation after outputting the fourth least significant bit as the transmission signal. For this, when the symbol size is determined to be 4 bits, and the count value input to the counting comparator 132 is the fourth count value, the counting comparator 132 generates a rising edge of the reset signal for stopping the counting operation, at the time point T4 and transmits the rising edge to the up/down counter 12. Specifically, when a count value of [1 0 1 1] is input to the counting comparator 132, the counting comparator 132 generates the rising edge of the reset signal at a first rising edge of the reference clock pulse. Thereafter, when the rising edge of the reset signal is input to the up/down counter 12, the up/down counter 12 stops the counting operation.

Through a series of the aforementioned operations, the digital data corresponding to the value of '−1' is modulated to generate a 4-bit symbol of [0 1 0 1].

FIG. 4 is a waveform diagram illustrating an input and an output of the band-pass filter applied to the digital modulation circuit according to the present invention.

Figure 4A:
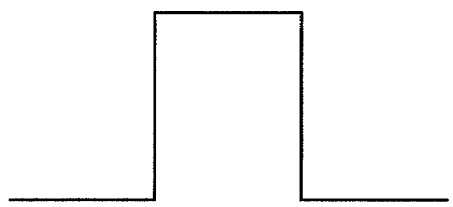
FIG. 4 is a waveform diagram illustrating an input and an output of a band-pass filter applied to a digital modulation circuit according to the present invention.
Figure 4B:
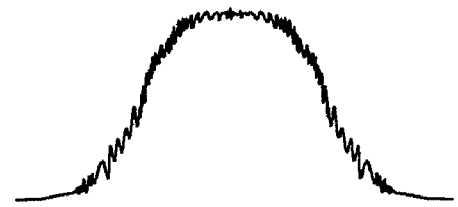

As illustrated in FIG. 4a, the symbol generated by the series of the aforementioned operations has the square waveform. The square waveform of the symbol is converted into the sine waveform as illustrated in FIG. 4b by passing though the band-pass filter 14 so as to be wirelessly transmitted by using an antenna.

The digital modulation method as described above can be applied in a case where a difference between a period of the reference clock pulse and a period of the carrier signal, that is, the symbol is not great. Particularly, a standard such as the IEEE 802.15.4a defines that the period of the reference clock pulse and the period of the carrier signal used for data transmission have an integer multiple relationship. According to the present invention, the period of the carrier signal (symbol) is two times the period of the reference clock pulse. Therefore, the present invention can be properly applied to the band-pass modulation of an ultra-wideband communication system. In addition, the carrier signal is generated to be in synchronization with the reference clock pulse, so that a receiver having a synchronization scheme can be implemented in a very simple structure.

As described above, according to the present invention, the modulation circuit can be constructed by using only the digital circuit, so that a structure of a transmitter can be simplified, and power consumption caused by a phase locked loop circuit and the like can be reduced.

In addition, a synchronization acquisition structure of the carrier signal in the receiver having the synchronization scheme can be simplified.

While the present invention has been shown and described in connection with the exemplary embodiments, it will be apparent to those skilled in the art that modifications and variations can be made without departing from the spirit and scope of the invention as defined by the appended claims.

What is claimed is:

1. A digital modulation circuit, comprising:
   a clock generator which generates a reference clock pulse having a predetermined period;
   an up/down counter which generates a count value having predetermined bits by up-counting or down-counting the reference clock pulse and outputs a bit in the count value as a transmission signal;
   a controller which determines a counting start/end time point of the up/down counter and determines which one of the up-counting operation and the down-counting operation of the up/down counter is to be performed, according to a value of digital transmission data that is to be transmitted; and
   a band-pass filter which converts a waveform of the transmission signal output from the up/down counter into a sine waveform.

2. The digital modulation circuit of claim 1, wherein the up/down counter outputs the least significant bit in the count value as the transmission signal.

3. The digital modulation circuit of claim 1, wherein a period of the transmission signal is an integer multiple of the predetermined period of the reference clock pulse.

4. The digital modulation circuit of claim 1, wherein the controller comprises:
- a microprocessor which generates an up/down signal for determining the up-counting operation or the down-counting operation of the up/down counter according to the value of the digital transmission data that is to be transmitted, generates an enable signal for determining the counting start of the up/down counter, and sets a symbol size of a modulated signal; and
- a counting comparator which receives the count value of the up/down counter, sets a counting end count value according to the symbol size set by the microprocessor, and when receives the set counting end count value, generates a reset signal for determining a counting end of the up/down counter.

5. The digital modulation circuit of claim 4,
wherein, when a rising edge of the enable signal is detected while the up/down signal is in a high-state, the up/down counter starts the up-counting operation to count a rising edge of the reference clock pulse and ends the up-counting operation at a rising edge of the reset signal, and
wherein, when the rising edge of the enable signal is detected while the up/down signal is in a low-state, the up/down counter starts the down-counting operation to count the rising edge of the reference clock pulse and ends the down-counting operation at the rising edge of the reset signal.

6. The digital modulation circuit of claim 5,
wherein, after the counting comparator receives a count value which is output when the counting operation is performed the same number of times as the symbol size, the counting comparator outputs a rising edge of the reset signal at a next counting time point, and
wherein the up/down counter stops the counting operation at the rising edge of the reset signal.

7. A digital modulation circuit, comprising:
- a clock generator which generates a reference clock pulse having a predetermined period;
- an up/down counter which generates a count value having 4 bits by up-counting or down-counting a rising edge of the reference clock pulse and outputs a least significant bit in the count value having 4 bits as a transmission signal;
- a microprocessor which starts the up/down counter performing the counting operation when digital transmission data that is to be transmitted is received, determines which one of the up-counting operation and the down-counting operation of the up/down counter is to be performed according to a type of the received digital transmission data, and sets a symbol size of a modulated signal;
- a counting comparator which receives the count value having 4 bits of the up/down counter, and stops the counting operation of the up/down counter after receiving a count value which is output when the counting operation is performed the same number of times as the symbol size set by the microprocessor; and
- a band-pass filter which converts a waveform of the transmission signal output from the up/down counter into a sine waveform.

8. The digital modulation circuit of claim 7,
wherein the symbol size is 4 bits, and
wherein the counting comparator stops the counting operation of the up/down counter after receiving the count value of [0 1 0 0] or [1 0 1 1].

* * * * *